United States Patent [19]

Asano

[11] Patent Number: 4,938,655
[45] Date of Patent: Jul. 3, 1990

[54] WAFER TRANSFER METHOD

[75] Inventor: Takanobu Asano, Yokohama, Japan

[73] Assignee: Tel Sagami Limited, Kanagawa, Japan

[21] Appl. No.: 313,902

[22] Filed: Feb. 23, 1989

[30] Foreign Application Priority Data

Feb. 25, 1988 [JP] Japan ................................. 63-40590

[51] Int. Cl.$^5$ ............................................. B65B 69/00
[52] U.S. Cl. .................................... 414/786; 414/404; 414/416; 414/417
[58] Field of Search ................ 414/786, 417, 416, 404

[56] References Cited

U.S. PATENT DOCUMENTS

| | | | |
|---|---|---|---|
| 4,573,851 | 3/1986 | Butler | 414/404 |
| 4,611,966 | 9/1986 | Johnson | 414/404 |
| 4,701,096 | 10/1987 | Fisher, Jr. | 414/404 X |
| 4,722,659 | 2/1988 | Hoyt, III et al. | 414/416 |
| 4,759,681 | 7/1988 | Nogami | 414/404 X |
| 4,806,057 | 2/1989 | Cay et al. | 414/225 |
| 4,840,530 | 6/1989 | Nguyen | 414/416 X |

*Primary Examiner*—Robert J. Spar
*Assistant Examiner*—Cheryl L. Gastineau
*Attorney, Agent, or Firm*—Oblon, Spivak, McClelland, Maier & Neustadt

[57] ABSTRACT

A wafer transfer method according to the present invention comprises taking out a plurality of wafers from a cassette while holding the wafers by a chuck mechanism, transporting the held wafers to a region over a boat, transferring all the wafers from the chuck mechanism to the boat so that the wafers are arranged in a predetermined position on the boat, relatively moving the chuck mechanism with respect to the boat for a distance equal to an integral multiple of a distance corresponding to the spacing of each wafer, and holding a required number of wafers, out of the plurality of wafers on the boat, by use of the chuck mechanism to dislocate the wafers on the boat or return the wafers to the cassette, and thereafter transferring a plurality of wafers from another cassette to the boat. According to the present invention, monitor wafers are arranged with predetermined distances between wafers on the boat, and product wafers are transferred from the second cassette to the spaces between the monitor wafers. Thus, the monitor wafers are arranged on the boat for each lot of product wafers. If the wafers in the cassette are subject to an omission, the wafers on the boat are moved for a distance corresponding to an omitted wafer or wafers so that the wafers are continuously arranged at regular pitches on the boat.

7 Claims, 5 Drawing Sheets

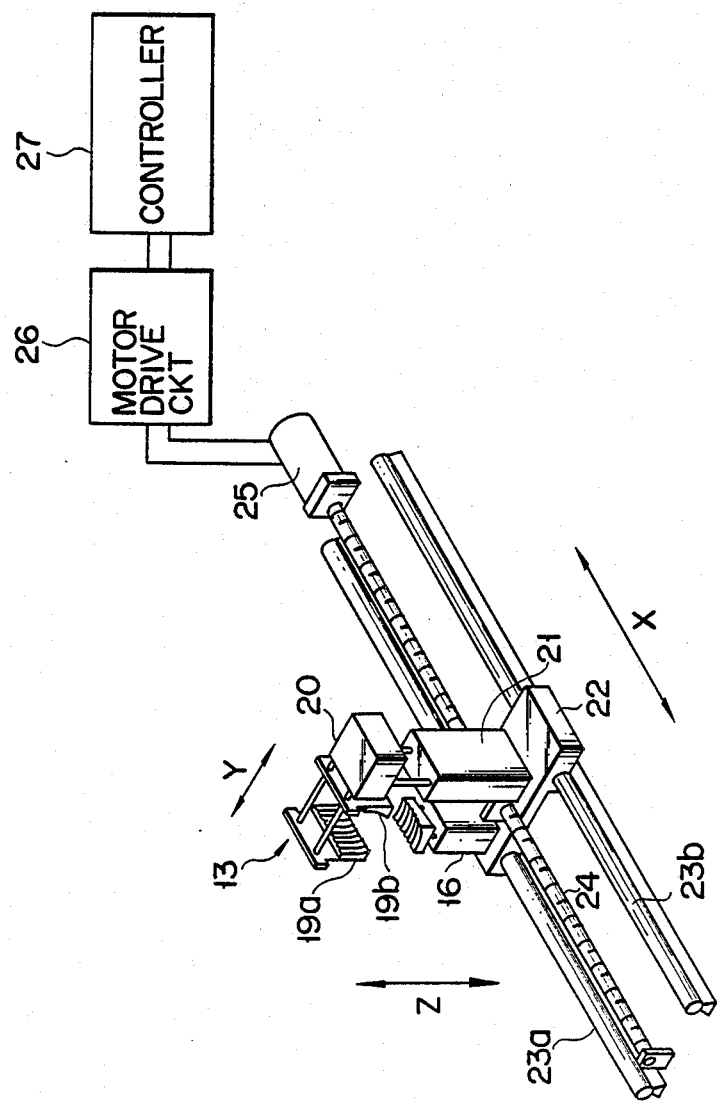
F I G. 2

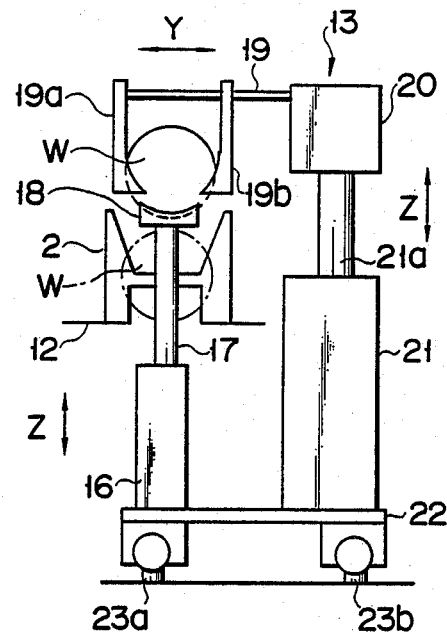
F I G. 3
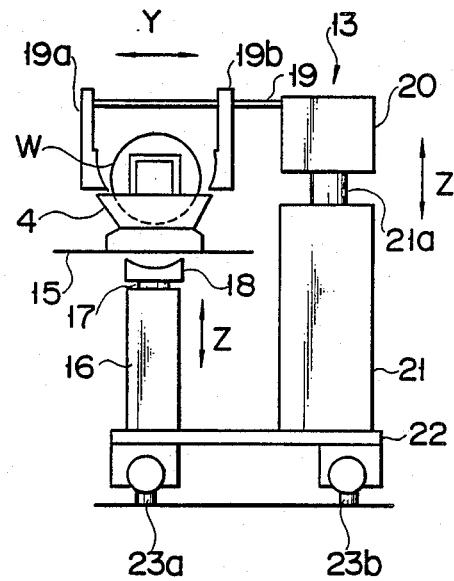
F I G. 4

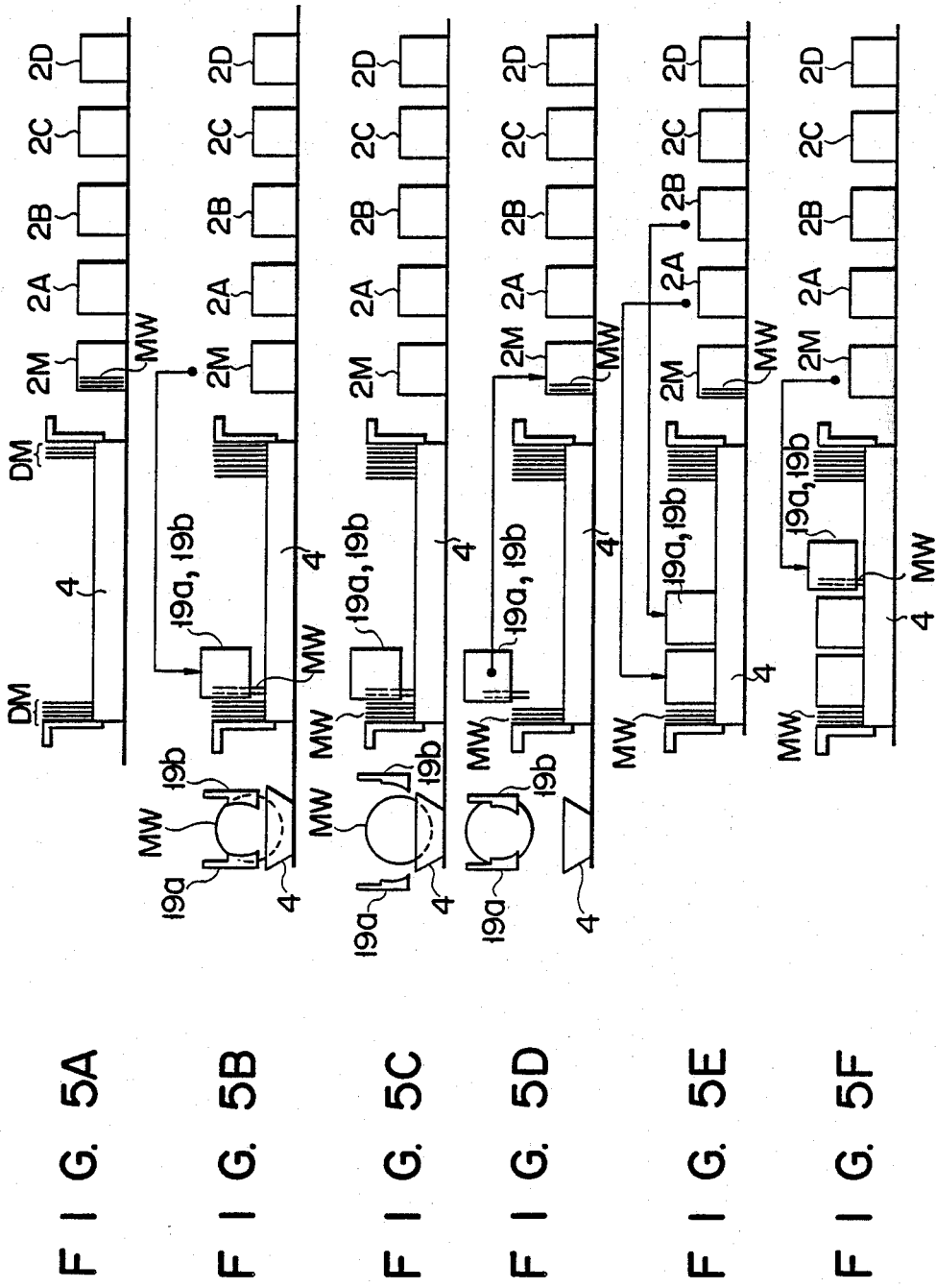

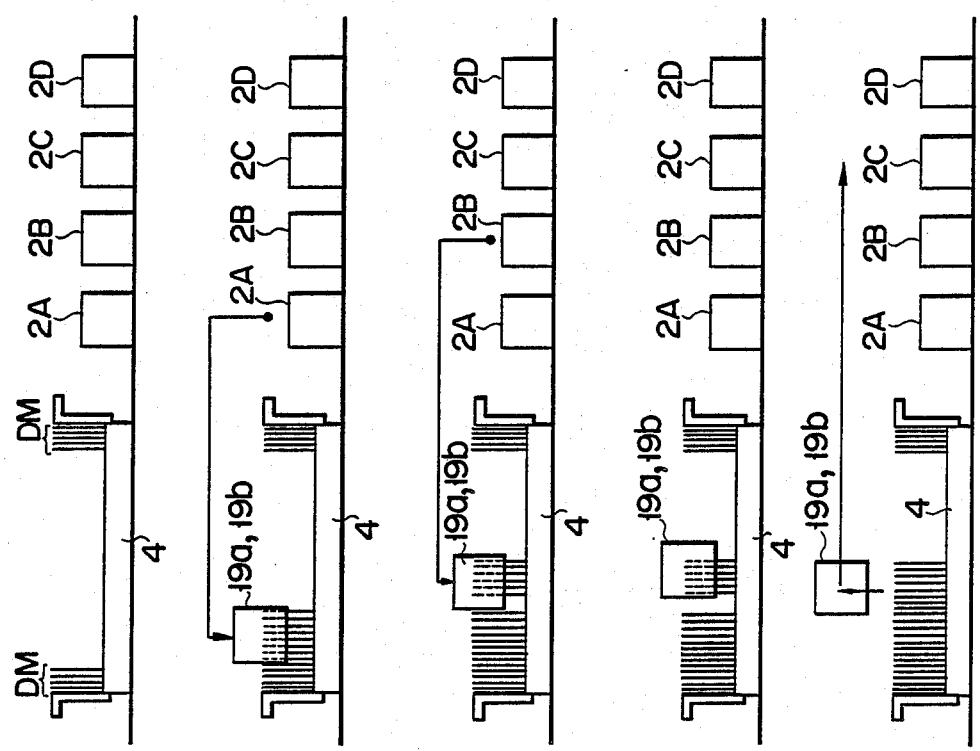

WAFER TRANSFER METHOD

BACKGROUND OF THE INVENTION

1. Field of the Invention

The present invention relates to a wafer transfer method for transferring a number of semiconductor wafers from cassettes (carriers) to a boat for heat treatment, and more particularly, to a wafer transfer method for efficiently automatically transferring semiconductor wafers when product wafers are mixed with wafers for monitoring.

2. Description of the Related Art

Semiconductor devices, such as ICs or LSIs, are manufactured by successively subjecting wafers, cut from an ingot, to a number of processes, including surface treatment, thermal oxidation, impurity diffusion, film deposition, etching, etc. During these manufacturing processes, each semiconductor wafer is repeatedly heat-treated.

Vertically stacked multi-stage furnaces, e.g., four-stage furnaces, are generally used as furnaces for the heat treatment of semiconductor wafers. A multi-stage holder is disposed in front of an inlet of each furnace. Various automatic devices for handling the wafers are mounted on the holder.

The semiconductor devices are loaded into or unloaded from the heating furnaces by means of wafer boats for exclusive use. Usually, each boat carries a maximum of 200 wafers as a lot.

Meanwhile, the semiconductor wafers are transported from a preceding stage to the heating furnaces by means of exclusive-use cassettes (or carriers). Usually, each cassette contains a maximum of 250 wafers as a lot. Accordingly, the wafers must be transferred from a plurality of cassettes to one boat.

In handling the wafers, an operators' hands are prohibited from directly touching them, for prevention of contamination. To attain this, an exclusive-use automatic wafer transfer apparatus, for use as incidental equipment for each heating furnace, is located in the vicinity of the furnace inlet. This apparatus serves to transfer the wafers automatically from the cassettes to each boat.

In general, semiconductor device manufacturers do not inspect all of heat-treated wafers, but they use a method wherein two or three wafers for monitoring (hereinafter referred to as monitor wafers) are sampled from the boat after the end of the heat treatment process, and the sampled monitor wafers are inspected for the thickness of film on their surface and other conditions. If the inspection results on the monitor wafers are acceptable, then product wafers are regarded as acceptable. Thus, the monitor wafers are arranged in predetermined positions at intermediate portions on either end side of an array of wafers on the boat.

Conventionally, in transferring these monitor wafers to a predetermined positions on the boat, each of them is stored beforehand in each cassette so that they are automatically transferred together with the product wafers, from the cassettes to the boat, by means of the wafer transfer apparatus.

According to this conventional method, however, the monitor wafers are previously stored in the cassettes, so that the product wafers cannot be fully contained in each cassette. If one monitor wafer is stored beforehand in each cassette, for example, only 24 product wafers can be contained in the cassette. Thus, the number of handleable product wafers per cassette is limited, so that the overall process efficiency is low.

Instead of mechanically transferring the monitor wafers by means of the wafer transfer apparatus, the operators may manually transfer the monitor wafers to the boat. In this case, however, the monitor wafers will be soiled or damaged, thereby entailing a reduction in the cleanliness of room air.

Moreover, each cassette does not always contain an entire lot of 25 wafers. If the wafers in the cassette are transferred directly to the boat when they are subject to an omission, they cannot be continuously arranged at regular pitches on the boat. As a result, the wafers inevitably undergo uneven heat treatment.

SUMMARY OF THE INVENTION

An object of the present invention is to provide a wafer transfer method in which product wafers to be heat-treated can be transferred to a boat by cassettes, without being contaminated, with heat-treating of the product wafers and monitor wafers.

Another object of the invention is to provide a wafer transfer method in which product wafers can be continuously arranged at regular pitches on a boat even though the wafers, when in cassettes, are subject to an omission.

According to an aspect of the present invention, there is provided a wafer transfer method, which comprises: a first step for taking out a plurality of wafers from a cassette while holding the wafers by holding means; a second step for transporting the held wafers to a region over a boat; a third step for transferring all the wafers from the holding means to the boat so that the wafers are arranged in a predetermined position on the boat; a fourth step of relatively moving the holding means with respect to the boat for a distance equal to an integral multiple of the spacing between to each wafer, and holding a required number of wafers, out of the plurality of wafers on the boat, by means of the holding means to dislocate the wafers on the boat or return the wafers to the cassette; and a fifth step of transferring a plurality of wafers from another cassette to the boat after the fourth step.

According to the present invention, monitor wafers are arranged at predetermined pitches on the boat during the first to fourth steps, and product wafers are transferred from the second cassette to the spaces between the monitor wafers during the fifth step. Thus, the monitor wafers are arranged on the boat for each lot of product wafers.

If the wafers in the cassette are subject to an omission, the wafers on the boat are moved for a pitch or pitches corresponding to an omitted wafer or wafers in the fourth step. Thus, the wafers are continuously arranged at regular pitches on the boat.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 2 is a perspective view schematically showing an X-axis shift mechanism at the lower portion of the wafer transfer apparatus;

FIG. 3 is a side view of the wafer transfer apparatus, illustrating the way wafers are lifted from a cassette and held by means of a chuck mechanism;

FIG. 4 is a side view of the wafer transfer apparatus, illustrating the way the wafers are transferred from the chuck mechanism to a boat;

FIGS. 5A to 5F are diagrams schematically illustrating processes of a wafer transfer method according to a first embodiment of the present invention, in which the wafers are transferred from the cassette to the boat; and FIGS. 6A to 6E are diagrams schematically illustrating processes of a wafer transfer method according to a second embodiment of the invention, in which the wafers are transferred from the cassette to the boat in a case such that the wafers in the cassette are subject to an omission.

DESCRIPTION OF THE PREFERRED EMBODIMENTS

Figure 1:
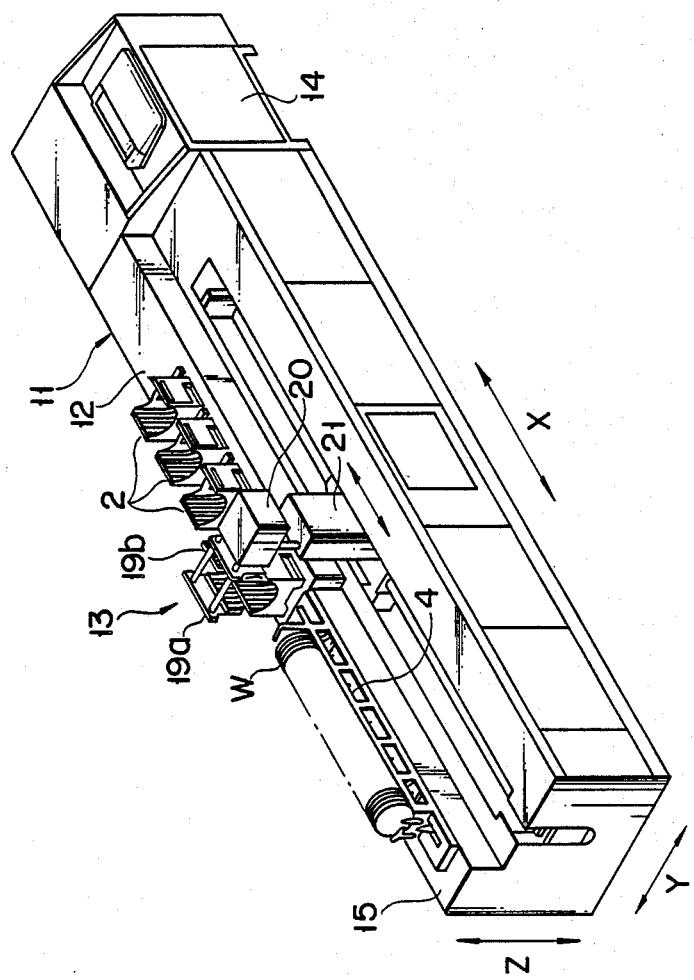
FIG. 1 is a perspective view of a wafer transfer apparatus used in a wafer transfer method according to one embodiment of the present invention.

Various embodiments of the present invention will now be described in detail with reference to the accompanying drawings.

Horizontal four-stage furnaces (not shown) are installed for oxidation and diffusion of silicon wafers, and a holder (not shown) for loading and unloading a boat is disposed so as to communicate with an inlet of each furnace. Each rack of the holder is provided with a soft landing device (not shown) having a quartz fork. The soft landing device includes a mechanism for sliding the fork in the longitudinal direction (X-axis direction) of the rack.

An elevator device (not shown), which has an arm for delivering the boat to the fork, is disposed on the front side of a heat-treatment furnace.

A wafer transfer table, which is used to transfer the wafers in cassettes to the boat, is located along the lowest rack of the holder.

As shown in FIG. 1, wafer transfer table 11 includes cassette stage 12 for carrying a number of wafer cassettes 2 and boat stage 15 for carrying boat 4. Stages 12 and 15 are arranged in line and at the same elevation with each other so that their longitudinal direction extends along the X-axis. Cassettes 2 and boat 4 are located on stages 12 and 15, respectively, so that a pattern forming surface of each wafer W extends along the Y-axis. Wafer carrying portions of cassettes 2 and boat 4 each have a number of grooves formed with predetermined pitches so as to extend along the edge curve of wafers W. Each wafer W is held in place so that its edge portion is fitted in any of the grooves.

Loading device 13 for loading wafers W from cassettes 2 into boat 4 is disposed on the front side of wafer transfer table 11. Device 13 includes panel 14 which is backed up by means of a computer system.

Necessary data can be key-inputted through panel 14. As shown in FIG. 2, a lower mechanism of loading device 13 constitutes an X-axis shift mechanism, which includes two guide shafts 23a and 23b, extending parallel to each other along the X-axis, and ball screw 24. Slide table 22 straddles guide shafts 23a and 23b, and supports an upper mechanism of device 13. Screw 24 is threaded in a nut on table 22. One end of screw 24 is coupled to a drive shaft of pulse motor 25, while its other end is rockably mounted on a frame of table 11.

A switch of pulse motor 25 is connected to motor drive circuit 26. Circuit 26 is connected to controller 27, which is backed up by means of the computer system. Thus, when a predetermined signal is delivered from the computer system to circuit 26 via controller 27, motor 25 is actuated, so that table 22 slides in the direction of the X-axis.

Referring now to FIGS. 3 and 4, the upper mechanism of loading device 13 will be described.

The upper mechanism of loading device 13 comprises a lift mechanism for lifting the wafers, a chuck mechanism for holding the wafers, and an up-and-down mechanism for moving the chuck mechanism. The lift mechanism includes first cylinder 16 having rod 17 which projects and retracts in the direction of the Z-axis. The chuck mechanism includes gear box 20 having two pairs of rods 19 which project and retract in the direction of the Y-axis. The up-and-down mechanism includes second cylinder 21 having rod 21a which, coupled to the casing of gear box 20 of the chuck mechanism, projects and retracts in the direction of the Z-axis.

Wafer receiving member 18 is provided on the distal end of rod 17 of the lift mechanism. Grooves with the same pitches as those of the wafer retaining grooves on the inside of each cassette 2 are formed on the top surface of member 18.

Gear box 20 of the chuck mechanism includes a plurality of motors (not shown) and a plurality of reduction gears (not shown). Cylinders of these individual systems are coupled to their corresponding pairs of rods 19. Wafer chuck members 19a and 19b are provided at the respective distal ends of each pair of rods 19. As rods 19 project or retract, chuck members 19a and 19b move away from or toward each other. Grooves with the same pitches as those of the wafer retaining grooves of each cassette 2 are formed on the opposite faces of members 19a and 19b.

In the chuck mechanism, one rod 19 penetrates wafer chuck member 19b lest chuck members 19a and 19b interfere with each other.

Referring now to FIGS. 5A to 5F, various processes of transferring wafers W from cassettes 2 to boat 4 will be described in detail.

[I] As shown in FIG. 5A, five wafer cassettes 2M, 2A, 2B, 2C and 2D and one boat 4 are placed individually in predetermined positions on stages 12 and 15. Cassette 2M is an exclusive-use cassette for a plurality of monitor wafers MW (e.g., three in number). This monitor wafer cassette and first to fourth product wafer cassettes 2A, 2B, 2C and and 2D are arranged in a line on cassette stage 12.

A plurality of dummy wafers DM (e.g., five in number) are previously housed in boat 4 on stage 15, so as to be arranged at regularly spaced distances at the front and rear portions of the boat. Twenty-five product wafers W are housed in each of first to fourth product wafer cassettes 2A, 2B, 2C and 2D.

Initial data are applied to the input of the computer by operating keys on panel 14. These data include data on the arrangement of monitor wafers MW and product wafers W on boat 4, the relative positions of boat 4 and cassettes 2M, 2A, 2B, 2C and 2D, etc.

A start signal is delivered from the computer to controller 27, and loading device 13 is slid in the direction of the X-axis so that wafer chuck members 19a and 19b are situated directly over cassette 2M.

[II] Compressed air is supplied to cylinder 16 of the lift mechanism, so that monitor wafers MW in cassette 2M are lifted to the elevation of wafer chuck members 19a and 19b by means of wafer receiving member 18. Then, members 19a and 19b are caused to approach each other, thereby holding the monitor wafers between them.

[III] Loading device 13 is slid from cassette stage 12 to boat stage 15, and is stopped at a predetermined position on the front side of boat 4, as shown in FIG. 5B. Then, rod 21a is drawn into second cylinder 21 so that monitor wafers MW are lowered to a predetermined position over boat 4, and the respective edges of wafers MW are fitted individually in the grooves of the boat. In the meantime, the approach of chuck members 19a and 19b and monitor wafers MW to boat 4 is detected by means of a sensor (not shown), and the operation of second cylinder 21 is stopped, while keeping wafers MW from running into boat 4 in accordance with the result of the detection. Then, chuck members 19a and 19b are opened to transfer three monitor wafers MW to boat 4, following the transfer of a train of three dummy wafers, as shown in FIG. 5B.

[IV] Subsequently, chuck members 19a and 19b, kept in the open state, are moved toward the rear face of boat 4 a distance corresponding to the spacing between each monitor wafer MW on boat 4, as shown in FIG. 5C. Then, members 19a and 19b are closed so as to hold the rearmost two of the three monitor wafers on the boat.

[V] Held between chuck members 19a and 19b, two monitor wafers MW are lifted, as shown in FIG. 5D, and are then moved in the direction of the X-axis, and stopped at the position directly over exclusive-use cassette 2M for MW on cassette stage 12. Then, members 19a and 19b are lowered so that the respective edges of monitor wafers MW are fitted individually in the grooves of cassette 2M. Thereafter, members 19a and 19b are opened to return the two monitor wafers to advanced positions in cassette 2M.

[VI] All of 25 product wafers W in first cassette 2A are lifted together by means of wafer receiving member 18, held and transported to boat 4 by means of chuck members 19a and 19b, and transferred to the position next to or on the right of monitor wafers MW on boat 4, as shown in FIG. 5E. Subsequently, product wafers W in second cassette 2B are transferred, in like manner, to the position on the right of the previously transferred product wafers on boat 4.

[VII] Two monitor wafers MW are transferred from exclusive-use cassette 2M to the position next to or on the right of product wafers W on boat 4, as shown in FIG. 5F. Chuck members 19a and 19b, kept in the open state, are moved for a distance corresponding to each monitor wafer MW, and are then caused to hold one of the two monitor wafers and return it to cassette 2M.

[VIII] Thereafter, substantially the same operations as aforesaid are repeated so that product wafers W are transferred successively from third and fourth cassettes 2C and 2D to boat 4.

[IX] After the wafer transfer is finished, boat 4 is transported to a delivery position. Thereafter, the boat is transported to the rack of the furnace to be used while being held by means of the arm of the elevator device. Then, boat 4 is transferred to the fork, and is inserted into the furnace by means of the soft landing device. Thereafter, heat treatment is executed at a predetermined temperature for a predetermined period of time.

Thus, only one of the monitor wafers MW transferred from exclusive-use cassette 2M to boat 4 is left on the boat, and all the other monitor wafers MW are held between chuck members 19a and 19b to be returned to cassette 2M. Therefore, monitor wafers MW need not be previously stored together with product wafers W, in cassettes 2A, 2B, 2C and 2D. As a consequence, twenty five product wafers W can be housed in each cassette 2.

The present invention is not limited to the first embodiment described above. In the first embodiment, for example, one monitor wafer MW is disposed among a group of product wafers. Alternatively, however, two or more monitor wafers may be arranged among the product wafer group.

In the first embodiment, moreover, wafers MW and W are transferred by moving wafer chuck members 19a and 19b. Alternatively, however, the wafers may be transferred by moving wafer transfer table 11.

With the use of the wafer transfer apparatus according to the aforementioned embodiment, furthermore, product wafers W can be transferred from cassettes 2 to boat 4 with a regular spacing between wafers even though wafers W in cassettes 2 are subject to an omission.

Referring now to FIGS. 6A to 6E, a wafer transfer method according to a second embodiment of the present invention will be described. In this case, product wafers W in cassettes 2 are subject to an omission. A repetitive description of those portions common to the first and second embodiments is omitted.

[I] As shown in FIG. 6A, four wafer cassettes 2A, 2B, 2C and 2D are placed individually in predetermined positions on cassette stage 12. Twenty-five product wafers W are stored in each of first, third, and fourth cassettes 2A, 2C and 2D. Second cassette 2B contains, for example, 23 product wafers W. In this case, first and second wafer retaining grooves of cassette 2B are vacant of wafers W.

Compressed air is supplied to cylinder 16 of the lift mechanism, so that product wafers W in cassette 2A are lifted to the elevation of wafer chuck members 19a and 19b by means of wafer receiving member 18. Then, members 19a and 19b are caused to approach each other, thereby holding the product wafers between them.

[II] Held between chuck members 19a and 19b, product wafers W are moved in the direction of the X-axis, as shown in FIG. 6B, and are then transferred to a predetermined position on boat 4.

[III] As shown in FIG. 6C, twenty-three product wafers W in second cassette 2B are transferred to boat 4.

[VI] Subsequently, chuck members 19a and 19b, kept in the open state, are moved toward the rear face of boat 4 for a distance corresponding to the spacing between each of to each two product wafers W on boat 4, as shown in FIG. 6D. Then, members 19a and 19b are closed so as to hold and lift the twenty-three product wafers on the boat.

[V] Chuck members 19a and 19b are moved toward the front face of boat 4 for two pitches, as shown in FIG. 6E, lowered, and then opened, thereby transferring product wafers W to boat 4. Thereafter, product wafers W are transferred successively from third and fourth cassettes 2C and 2D to boat 4.

In this manner, product wafers W are continuously arranged at regular distances on boat 4.

The following is a general description of the effects of the present invention.

According to the present invention, monitor wafers MW and product wafers W can be automatically loaded onto boat 4 in a separate manner, without being previously mixed together in one and the same cassette. Therefore, product wafers W can be fully contained in each cassette, so that they can be transferred to the boat by cassettes. Thus, the yield of products can be improved. Since the wafers need not be manually transported by operators, they can be prevented from being contaminated, thus enjoying improved cleanliness.

According to the present invention, moreover, an omission of product wafers W in the cassettes can be properly compensated. Thus, the operating efficiency of the wafer transfer apparatus can be considerably improved.

What is claimed is:

1. A wafer transfer method comprising:
    a first step of taking out a plurality of wafers from a cassette while holding the wafers by means of holding means;
    a second step of transporting the held wafers to a region over a boat;
    a third step of transferring all the wafers from the holding means to the boat so that the wafers are arranged in a predetermined position on the boat;
    a fourth step of moving the holding means relative to the boat by a distance equal to an integral multiple of a spacing between two adjacent wafers, and holding a required number of wafers, out of the plurality of wafers on the boat, by means of the holding means to remove the required number of wafers on the boat; and
    a fifth step of transferring a plurality of wafers from another cassette to the boat after the fourth step.

2. The wafer transfer method according to claim 1, wherein said wafers handled in said first to fourth steps are monitor wafers for product inspection, and said wafers handled in said fifth step are final product wafers.

3. The wafer transfer method according to claim 2, wherein said fourth step includes moving the holding means relative to the boat for a distance equal to a distance corresponding to a spacing between each monitor wafer, and holding and lifting all the monitor wafers on the boat but one.

4. The wafer transfer method according to claim 1, wherein all of said wafers handled in said first to fifth steps comprise final product wafers.

5. The wafer transfer method according to claim 4, wherein said fourth step includes moving the holding means relative to the boat for a distance equal to a distance corresponding to a spacing between omitted wafers out of the product wafers in the cassette.

6. The wafer transfer method according to claim 1, which comprises controlling movement of said holding means relative to said boat by means of a computer system.

7. A wafer transfer method comprising:
    a first step of taking out monitor wafers from a first cassette of a cassette section, while holding the monitor wafers by means of holding means, said cassette section including a first cassette containing monitor wafers only and a second cassette containing product wafers only;
    a second step of arranging held monitor wafers in a predetermined position on a boat;
    a third step of moving the holding means relative to the boat for a distance equal to an integral multiple of a distance between each wafer so that the monitor wafers are arranged on the boat, and holding some of the monitor wafers on the boat by means of the holding means and returning the held monitor wafers to the first cassette so that a required number of monitor wafers remain on the boat; and
    a fourth step of moving the holding means to the position of the second cassette so as to hold all the product wafers in the second cassette by means of the holding means and arranging the product wafers next to a train of monitor wafers on the boat.

* * * * *